United States Patent [19]
Jahns

[11] Patent Number: 5,711,843
[45] Date of Patent: Jan. 27, 1998

[54] SYSTEM FOR INDIRECTLY MONITORING AND CONTROLLING A PROCESS WITH PARTICULAR APPLICATION TO PLASMA PROCESSES

[75] Inventor: Gary L. Jahns, San Diego, Calif.

[73] Assignee: Orincon Technologies, Inc., San Diego, Calif.

[21] Appl. No.: 392,631

[22] Filed: Feb. 21, 1995

[51] Int. Cl.⁶ .................................................. H01L 21/66
[52] U.S. Cl. .................. 156/345; 156/626.1; 156/643.1; 156/646.1; 216/58; 216/60; 216/67
[58] Field of Search ............................. 156/626.1, 643.1, 156/646.1, 345; 216/58, 60, 65–67, 85

[56] References Cited

U.S. PATENT DOCUMENTS

| | | | |
|---|---|---|---|
| 4,861,419 | 8/1989 | Flinchbaugh et al. | 156/626.1 |
| 5,014,217 | 5/1991 | Savage | 216/60 |
| 5,326,975 | 7/1994 | Barna | 216/60 |
| 5,362,356 | 11/1994 | Schoenborn | 156/626 |
| 5,467,883 | 11/1995 | Frye et al. | 216/60 |

OTHER PUBLICATIONS

A. Stubberud et al., "Improved Nonlinear System Identification Using Neural Networks", Proc. of the 7th International Conference on Neural Networks and Their Applications, Dec. 1994, pp. 49–57.

P. Simpson, "Fuzzy Min–Max Neural Networks—Part 1: Classification", IEEE Trans. on Neural Networks, vol. 3, No. 5, Sep. 1992, pp. 776–786.

P. Simpson, "Fuzzy Min–Max Neural Networks—Part 2: Clustering", IEEE Trans. on Fuzzy Systems, vol. 1, No. 1, Feb. 1993, pp. 32–45.

C. Himmel et al., "Advantages of Plasma Etch Modeling Using Neural Networks Over Statistical Techniques", IEEE Trans. on Semiconductor Manufacturing, vol. 6, No. 2, May 1993, pp. 103–111.

*Primary Examiner*—T. Tung
*Attorney, Agent, or Firm*—Gray Cary Ware & Freidenrich

[57] ABSTRACT

The invention enables real-time control of a process using information regarding process properties that are indirectly related to the state of the process. A set of properties that characterize the process environment (fingerprint) is measured and used by a process results estimator to infer information regarding the state of the process and by a process condition monitor for monitoring the process to ascertain whether a particular type of condition exists. In one embodiment, optical emission spectra (OES) are used as the fingerprint. The process results estimator is sufficiently powerful to enable the process state to be inferred even when the relationship between the process environmental properties and the process state is complicated and difficult to describe with traditional mathematical models. In one embodiment, the process results estimator is embodied by a neural network. The process condition monitor can also be embodied by a neural network. Because the invention does not directly measure the process state, the invention is particularly useful in situations in which it is difficult or undesirable to directly determine the state of the process during the process such as monitoring and control of a plasma process such as plasma etching.

12 Claims, 7 Drawing Sheets

SYSTEM FOR INDIRECTLY MONITORING AND CONTROLLING A PROCESS WITH PARTICULAR APPLICATION TO PLASMA PROCESSES

BACKGROUND OF THE INVENTION

1. Field of the Invention

This invention relates to monitoring and controlling a process using information that is indirectly related to the state of the process. More particularly, the invention relates to monitoring and controlling a plasma process. Most particularly, the invention relates to monitoring and controlling a plasma process for use in processing a semiconductor material such as in fabrication of very large-scale integrated circuits.

2. Related Art

It is desirable to be able to monitor and control a process in real time to ensure that the process is carried out as desired. Typically, this is done by monitoring one or more aspects of the process, comparing the state of the monitored aspects to a desired state, and controlling one or more inputs to the process based upon the comparison.

Plasma processing of, for example, semiconductor wafers is a type of process for which such real-time control would be valuable. In semiconductor processing, tight control of process conditions and cleanliness is necessary to achieve economical manufacturing of integrated circuits with submicron features sizes. Process failure and under-utilization of processing equipment are two causes of high costs in such manufacturing.

A typical plasma process for which intelligent control would be useful is plasma etching. Plasma etching processes and apparatus are well known. Control of plasma etching processes is important to achieve good etch selectivity (etching only of material desired to be etched), achieve good endpoint detection (detection that the material to be etched has been completely removed before an underlying material is inadvertently etched), and minimize undercutting or notching of the sidewall of the cavity or groove to be etched.

Previously, control of plasma processes for use in processing semiconductor wafers has been achieved by using "recipes" for control of various process parameters. The recipes prescribe, for each time during the process, particular gas mixtures, gas flow rates, gas pressures and applied power levels. However, the recipes cannot be varied during processing so that idiosyncratic effects that occur during a particular process cannot be accommodated.

Optical emission from the plasma discharge has been used at a selected wavelength for endpoint determination in plasma etching (see, e.g., U.S. Pat. No. 5,362,356). Additionally, interferometry has been used to detect thickness changes in large features on wafers. While these techniques provide useful information on single aspects of the plasma process, they do not use information contained within a spectral pattern (i.e., plasma emission at many different wavelengths) to monitor the etch process more completely. Moreover, in these techniques, control of the process is based on external settings of process parameters rather than on in situ measured process results.

Some methods do exist for measuring process results in situ. These methods typically directly determine process results by measuring certain properties of the process which are directly related to the process results. However, these methods are typically unnecessarily intrusive, disturbing the conduct of the process, and expensive.

SUMMARY OF THE INVENTION

The invention enables real-time control of a process using information regarding process properties that are indirectly related to the state of the process. In one embodiment, the invention includes: i) a process condition monitor for monitoring the process to ascertain whether a particular type of condition exists; ii) a process results estimator for producing a process condition estimate at an instant in time; iii) means for comparing the process condition estimate to a target state to produce a process condition difference; and iv) means for calculating a control response as a function of the process condition difference, the control response adapted to effect control of a processing apparatus that is used to implement the process.

A set of properties that characterize the process environment (environment fingerprint) is measured and used by the process results estimator to infer information regarding the state of the process (i.e., infer the state of one or more process conditions). These properties are not directly related to the process conditions.

In one embodiment of the invention, optical emission spectra (OES) are used as the fingerprint of a plasma process from which information about various process conditions (e.g., etch rate, selectivity and uniformity in a plasma etch process) is inferred. The optical emission spectra are a consequence of the state of plasma. Likewise, the process conditions are a consequence of the state of the plasma. Thus, though the optical emission spectra and process conditions are not directly related, according to the invention, a correlation is developed between the optical emission spectra and the process conditions that enables the state of the process conditions to be estimated for any optical spectrum.

The process results estimator is sufficiently powerful to enable the process state to be inferred even when the relationship between the environment fingerprint and the process state is complicated and difficult to describe with traditional mathematical models. In one embodiment, the process results estimator is embodied by a neural network. The process condition monitor can also be embodied by a neural network. Because the process results estimator and the process condition monitor are implemented separately, each of the process results estimator and process condition monitor can be implemented with the type of neural network that is best for the type of function being performed.

Because the invention does not directly measure the process state, the invention is particularly useful in situations in which it is difficult or undesirable to directly determine the state of the process during the process. Plasma processes are such processes and the invention is particularly useful in their control. For example, the invention can be used to monitor and control a plasma process, such as plasma etching, for use in processing a semiconductor wafer.

Intelligent Control of plasma processing significantly increases equipment utilization and greatly reduce process failures. Further, when used to control plasma etching, the invention enables good control of etch selectivity, etch rate and etch uniformity.

DETAILED DESCRIPTION OF EMBODIMENTS OF THE INVENTION

Figure 1:
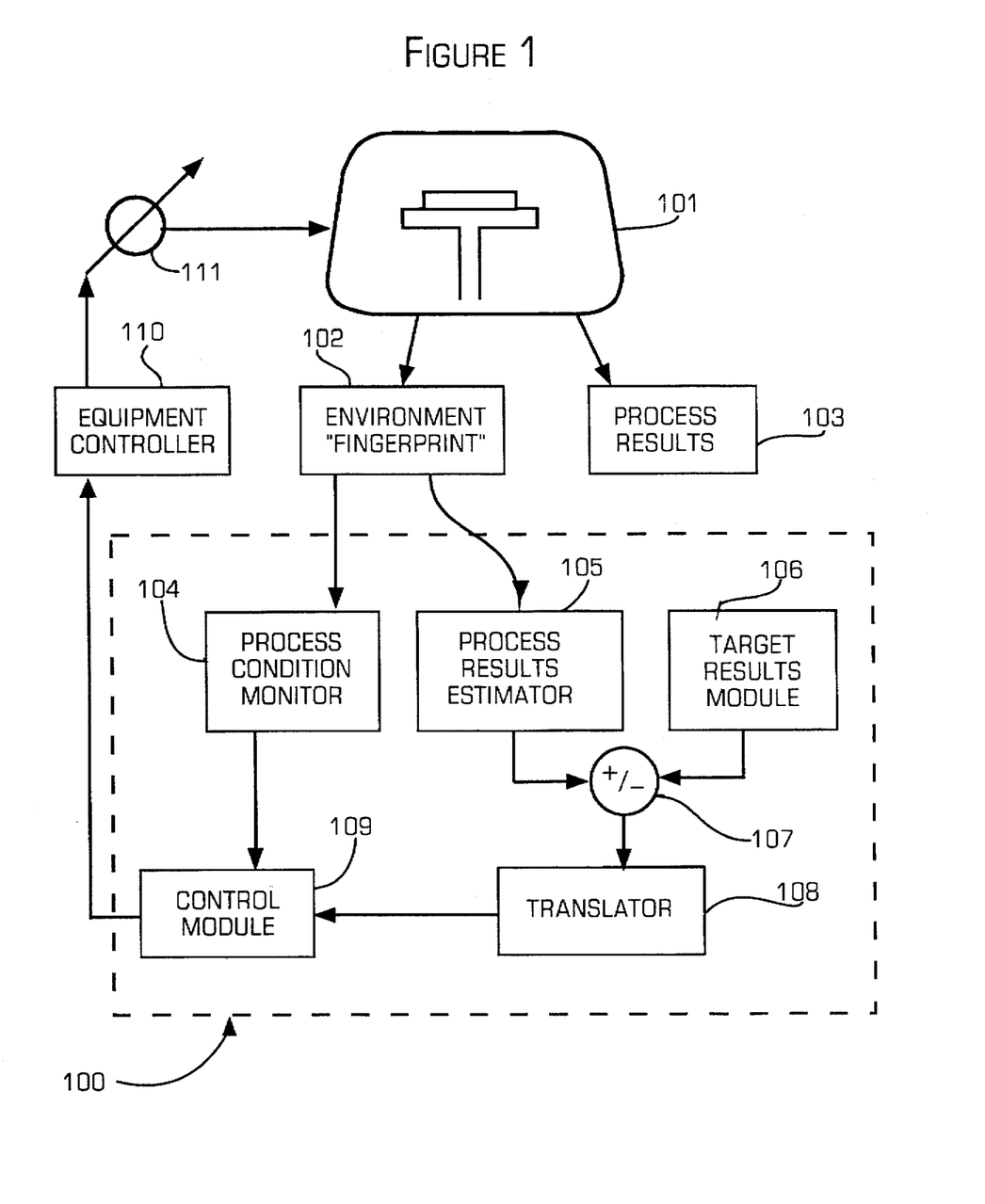
FIG. 1 is a block diagram of a process control system according to one embodiment of the invention.

FIG. 1 is a block diagram of a process control system 100 according to one embodiment of the invention. The system 100 includes a process condition monitor 104, a process results estimator 105, a target results module 106, an error detector 107, a translator 108 and a control module 109. The system 100 is used to monitor and control a process in real time. In particular, the system 100 can use information that is indirectly related to the state of the process to control the process. The system 100 can be used, for example, to monitor and control a plasma process such as is used, for example, in processing a semiconductor wafer.

The process creates a process environment 101 that is characterized by a multiplicity of properties. For example, where the process environment 101 is a plasma processing chamber, the properties include, for example, the temperature of the plasma, the gas pressure inside the chamber, the plasma density, the gas flow rate into and out of the chamber, the concentration of each gas within the chamber, and the intensity and wavelength of light emitted from the chamber. Typically, each property is related to one or more other properties in some way. In a plasma processing chamber, the temperature of the plasma, the pressure inside the chamber and the plasma density are an example of a group of properties that are interrelated with each other. Moreover, some of the properties may be subject to external control while others cannot be controlled directly. For a plasma process chamber, properties such as the gas flow rate into the chamber can be controlled directly while other properties, such as the intensity and wavelength of light emitted from the chamber, cannot be directly controlled.

The state of a property at any given time during the process can often be measured. The information regarding the instantaneous state of one or more properties can be used to monitor the state of the process to enable real-time control of the process in response to the monitored state. For example, the information about the properties can be used to infer information regarding the manner in which the process is occurring. The procedure for using information about the properties to infer information regarding the process state is called a "virtual diagnostic."

According to the invention, the state of one or more properties of the process environment 101 is measured and represents an environment "fingerprint" 102. In particular, according to the invention data is obtained as the fingerprint 102, inference is made as to the process state and that inferred process state is used to control the process.

Figure 2A:
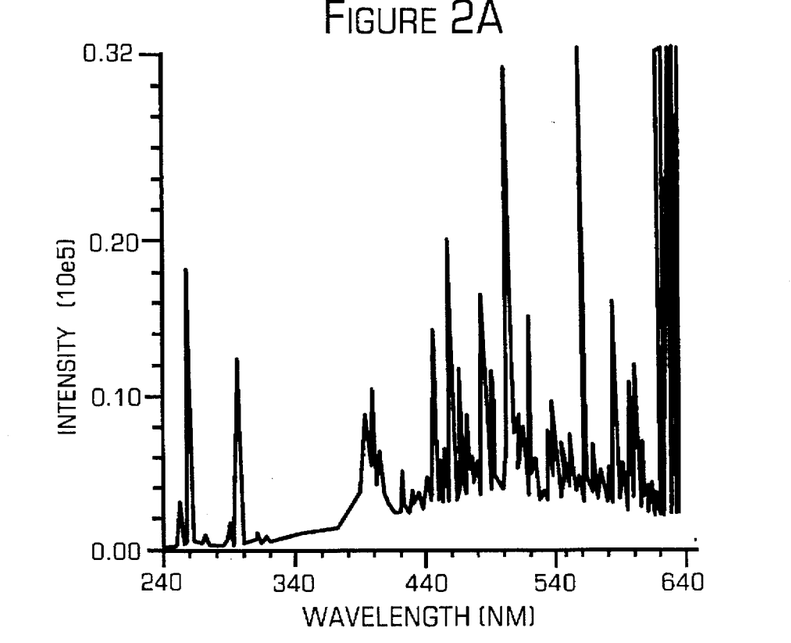
FIG. 2A is a graph of light intensity as a function of wavelength, illustrating the use of data to "fingerprint" a state of a process for use with the invention.

According to one embodiment of the invention, the fingerprint 102 is a profile of the intensity of a predefined multiplicity of wavelengths of light emitted from a plasma process chamber at an instant in time. FIG. 2A is a graph of such a light intensity profile 200 ("optical spectrum"). The optical spectrum arises due to atomic transitions of the constituent gasses during the plasma process. The exact characteristics of the optical spectrum are a consequence of the particular state of the plasma. The process conditions (e.g., etch rate, etch uniformity and etch selectivity) are also a consequence of the particular state of the plasma. Thus, according to the invention, it is possible to empirically determine a relationship between optical spectra and process conditions. The relative magnitudes of light intensity among wavelengths of an optical spectrum are particularly important in inferring the state of the process (i.e., process conditions). The absolute magnitude of the light intensities of an optical spectrum can also provide information about the process state. The manner in which the correspondence between the optical spectra and process conditions (process state) is made is described in more detail below.

The process results 103 are also measured after the process is complete and the processed material, such as a semiconductor wafer, is removed from the chamber. This information is useful for establishing correspondence between the fingerprint and the process results.

The fingerprint 102 is input to a process condition monitor 104. One implementation of a process condition monitor 104 according to the invention is discussed in more detail below. The process condition monitor 104 monitors the process properties to determine whether an "out-of-bounds" condition exists, or whether another, predetermined condition exists.

For example, in a plasma process, when an air leak occurs in the plasma chamber, nitrogen is present in the plasma chamber that should not be present. The presence of nitrogen would cause an optical spectrum that could be detected by the process condition monitor 104 as an optical spectrum that does not fall within the universe of "acceptable" optical spectra, i.e., those optical spectra that could possibly occur if the process was operating without an air leak in the plasma chamber. The process condition monitor 104 would report that an "out-of-bounds" condition exists.

The process condition monitor 104 can also detect any of a number of other "out-of-bounds" conditions that may arise because of defective operation of the process. For instance, the process condition monitor 104 can detect such a condition that arises from failure of the mass flow controller, a common problem in plasma processes.

The process condition monitor 104 can also detect when a predetermined condition exists. For example, the process condition monitor 104 can perform endpoint detection in a plasma etching process. In plasma etching, a material is gradually removed to expose an underlying material. When the material to be etched is removed, the environment in the plasma chamber no longer includes particles of the etched material. As these particles disappear from the plasma chamber environment, the optical spectrum changes. The process condition monitor detects when the optical spectrum has changed in such a manner as to indicate the etch endpoint.

The fingerprint 102 is also input to a process results estimator 105. One implementation of a process results estimator 105 according to the invention is discussed in more detail below. The process results estimator 105 uses the fingerprint 102 to estimate the state of one or more process conditions. In an embodiment of the invention for use with monitoring and controlling a plasma etching process, the process results estimator 105 can be used to determine, for example, one or more of the etch rate, the etch uniformity and the etch selectivity. The process condition estimate is used to adjust, as necessary, one or more process parameters (e.g., gas flow rates, gas mixtures, applied power level, gas pressures) that can be controlled externally, as necessary, to change the process so that the desired process condition or conditions are achieved.

Figure 2B:
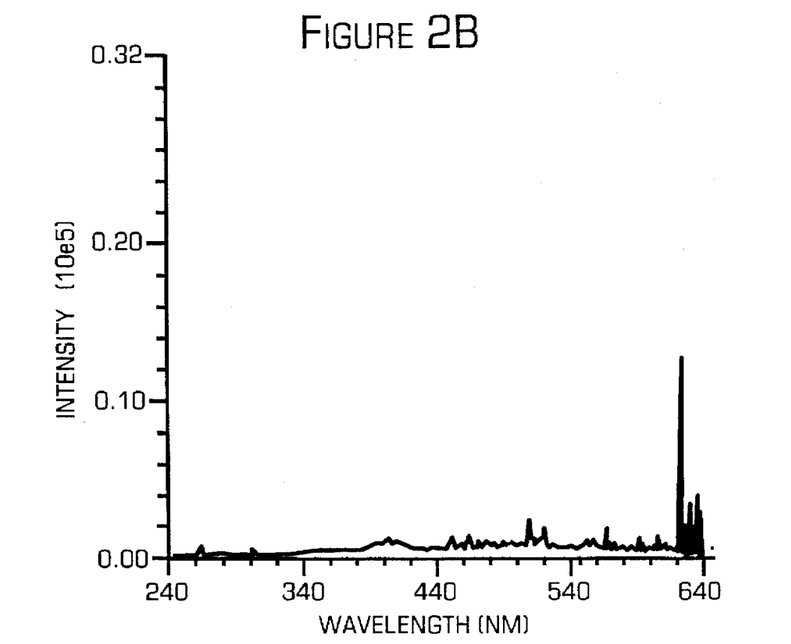
FIG. 2B is a graph of light intensity as a function of wavelength that, when compared to FIG. 2A, illustrates the use of the invention to monitor a process.

FIG. 2B is a graph of another optical spectrum 210. Comparison of the optical spectra 200 and 210 of FIGS. 2A and 2B, respectively, illustrates how the process results estimator 105 can be used to estimate the state of a process condition. The optical spectrum 200 was obtained for one setting of controls that resulted in etching of polysilicon to a depth of 1027.5 nanometers in 20 seconds. The optical spectrum 210 was obtained for different control settings that produced etching of polysilicon to a depth of 758.0 nanometers in 20 seconds. As can be seen from FIGS. 2A and 2B, the optical spectra 200 and 210 are quite different. The process results estimator 105 can be "trained" to recognize optical spectra such as optical spectra 200 and 210 to infer information about process conditions such as etch rate.

In a particular embodiment of the invention for use with monitoring and controlling a plasma process, the fingerprint 102 includes the light intensity for approximately 1000 wavelengths. This number of wavelengths is sufficiently large to provide enough information to be able to discriminate adequately between various process states, thereby enabling the process state at a given time to be identified with sufficient particularity. At the same time, this number of wavelengths does not produce a prohibitive amount of data so that implementation of the invention is computationally difficult or so that training of the process results estimator 105 becomes difficult or impossible.

The process condition estimate from the process results estimator 105 is compared by an error detector 107 to a target condition specified by the target results module 106. The target condition is established as a set of process conditions that are appropriate for each stage of the process, based upon previous performances of the process.

The difference between the process condition estimate and the target condition estimate is calculated by the error detector 107 and input into a translator 108.

The translator 108 uses the calculated difference to determine a control response, such as an electrical voltage. This information is then input into a control module 109. The process condition monitor 104 also produces status information that is input into the control module 109.

The control module 109 uses the input information to produce control signals which are sent to the equipment controller 110. The control module 109 can be implemented, for instance, as digital circuitry or in a digital computer as a computer program. Based upon the control signals, the equipment controller 110 operates various components of the processing apparatus 111 to control the state of one or more process parameters. For example, if an out-of-bounds condition exists, the control module 109 instructs the equipment controller 110 to immediately shut down the processing apparatus 111. Or, if an endpoint has been reached, the control module 109 instructs the equipment controller 110 to conduct a normal shutdown of the processing apparatus 111.

If neither an endpoint or an out-of bounds condition exist, then the control module 109 instructs the equipment controller 110 to control the processing apparatus 111 to attempt to achieve the desired process state. The control module 109 also performs other functions such as, for example, integrating the etch rate over time to obtain etch depth when the system 100 is used to monitor a plasma etching process.

The change in the process parameters causes a change in the process conditions of the process environment 101 so that a different fingerprint 102 is detected. The new fingerprint 102 is used as described above to control the processing apparatus 111 to change or maintain the process parameters as necessary to achieve the desired process conditions.

Figure 3:
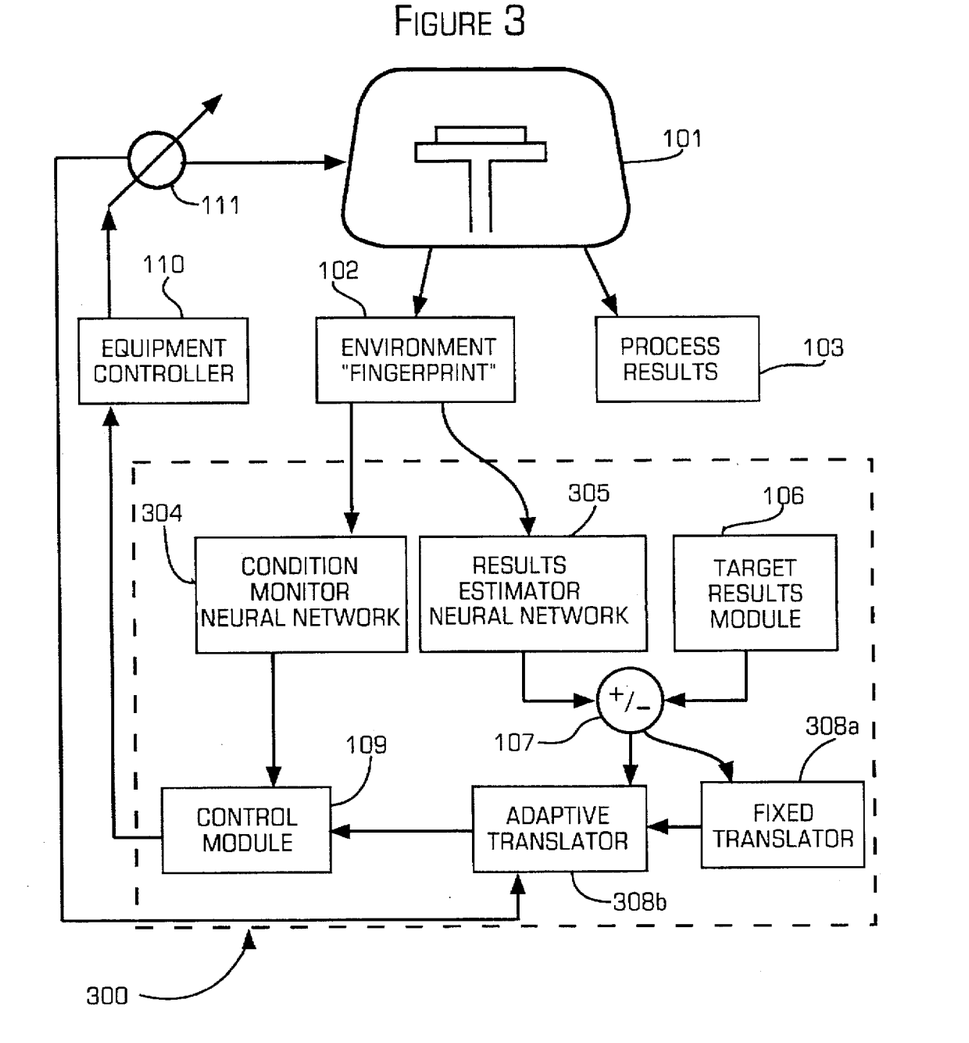
FIG. 3 is a block diagram of a process control system according to another embodiment of the invention.

FIG. 3 is a block diagram of a process control system 300 according to another embodiment of the invention. The process control system 300 is similar to the process control system 100 (FIG. 1) and elements common to both systems are designated by the same numerals.

In the process control system 300, the process condition monitor 104 and the process results estimator 105 of the system 100 are implemented as a condition monitor neural network 304 and a results estimator neural network 305, respectively. Further, the translator 108 of the system 100 is embodied by a fixed translator 308a and an adaptive translator 308b, each of which can also be implemented as a neural network. Generally, any neural network can be used to implement the condition monitor neural network 304, the results estimator neural network 305, the fixed translator 308a and the adaptive translator 308b.

The implementation and use of neural networks is known to those skilled in the art. Briefly, a neural network is a processing structure that attempts, either with hardware or software, to emulate the function of an animal nervous system. Typically, neural networks are made up of a large number of simple processing elements, each of which is structured like an animal neuron. Usually, a multiplicity of inputs to the processing device are processed to produce a single output. Each processing element is typically interconnected with a large number of the other processing elements. As a result, a large number of processing paths exist in the network.

Neural networks possess the attributes of distributed information storage, inherently parallel processing, fast single-pass calculation of output, insensitivity to noisy input, general fault tolerance, and capacity for modeling nonlinear control systems. All of these attributes are advantageous for the present invention.

In a particular embodiment of the invention, the results estimator neural network 305 is a multilayer perceptron neural network. Multilayer perceptron neural networks are sometimes alternatively referred to as feed-forward networks or feed-forward error back propogation networks A multilayer perceptron neural network is particularly good at estimating the value of a function. Thus, a multilayer perceptron neural network is particularly useful for implementing the process results estimator 105 (FIG. 1), which is used to estimate the state of one or more process conditions using the process fingerprint. A multilayer perceptron neural network that can be used with the invention is described in detail in Himmel, C. D. and May, G. S., "Advantages of Plasma Etch Modeling Using Neural Networks Over Statistical Techniques," IEEE Trans. on Semiconductor Manufacturing, Vol. 6, No. 2, May 1993, the disclosure of which is incorporated by reference herein. Below, a brief description of a multilayer perceptron neural network is given with respect to FIGS. 4A, 4B and 4C.

Figure 4A:
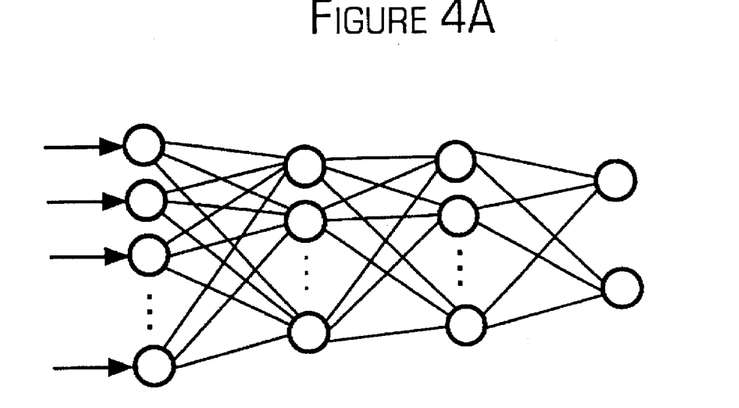
FIG. 4A is a schematic diagram of a multilayer perceptron neural network that illustrates the structure of a multilayer perceptron neural network for use with the invention.

FIG. 4A is a schematic diagram of a multilayer perceptron neural network 400 that illustrates the structure of a multilayer perceptron neural network for use with the invention. The network 400 includes a multiplicity of processing elements, e.g., processing element 401. The processing elements are arranged in "layers." The network 400 includes four layers 411 through 414; more layers could be included in a multilayer perceptron network for use with the invention. Each processing device of a layer communicates with one or more processing devices in the layer "above" and one or more processing devices in the layer "below" that layer. For example, the processing device 401 of the layer 412 communicates with each of the processing devices 402, 403, 404 and 405 of the layer 411 and the processing devices 406, 407 and 408 of the layer 413.

An input is supplied to each of the processing devices 402 through 405 of the layer 411 ("input layer"). The input to each processing device 402 through 405 is processed and the resultant output passed as an input to one of the processing devices in the layer 412. These processing devices each process the respective inputs and produce an output which is passed as an input to the processing devices of the next layer 413. The processing devices in layer 413 provide input to the processing devices in layer 414 which, in turn, produce the output of the network 400. The layers 412 and 413 are referred to as "hidden layers" and the layer 414 is referred to as an "output layer." Since information is passed forward from the input layer through the hidden layers to the output layer, the network 400 is referred to as a "feed-forward configuration."

Figure 4B:
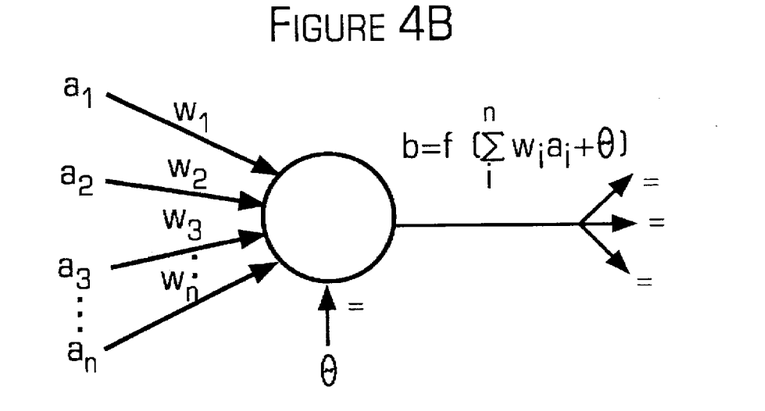
FIG. 4B is a simplified schematic diagram of a processing element that may be used in the multilayer perceptron neural network of FIG. 4A.

FIG. 4B is a simplified schematic diagram of a processing element 420 that may be used in the multilayer perceptron neural network 400. A multiplicity of inputs $a_1$ through $a_n$ are input to the processing device 420. The processing device 420 multiplies each input $a_1$ through $a_n$ by a corresponding weight $w_1$ through $w_n$ and adds a constant bias theta (which can be zero) to the result. This result is then passed through a "squashing" function to produce the output b from the processing element 420.

Figure 4C:
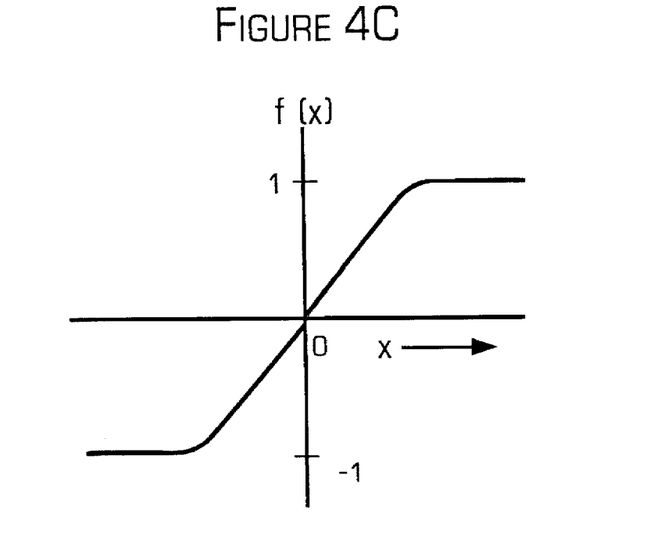
FIG. 4C is a graph of a sigmoid function that represents the processing function of the processing element of FIG. 4B.

FIG. 4C is a graph of a sigmoid function that represents the squashing function of the processing device 420. The sigmoid squashing function causes the processing device output to have two important characteristics: 1) the values of the output are bounded, and 2) the output is nonlinear. The importance of 1) is that excessively large (positive or negative) inputs are constrained to bounded outputs, so that no extreme outputs are produced. The importance of 2) is that the nonlinear response allows the network to model nonlinear input-output mappings.

Neural networks can be "trained" to learn an input/output mapping. Training a neural network requires a set of exemplars, i.e., examples of input and the associated output. For the multilayer perceptron network 400, each input $a_1$ through $a_n$ is presented to the network 400 and the network produces a corresponding set of outputs. An error is formed from the root-mean square of all the differences between expected outputs and outputs produced by the network. Corrections to the weights $w_1$ through $w_n$ are estimated and the weights $w_1$ through $w_n$ are adjusted in a manner calculated to reduce the error. New outputs are calculated using the new weights $w_1$ through $w_n$ and compared to the expected outputs. This process is repeated until the outputs produced by the network 400 are acceptably close to the expected outputs.

According to the invention, the results estimator neural network 305 is trained in the above manner. In one embodiment of the invention for use in monitoring a plasma process, a multiplicity of optical spectra (as shown in FIGS. 2A and 2B above) are measured and corresponded to measured values of certain process conditions such as etch rates, uniformity, etc. These correspondences are used to train the neural network to estimate process condition values for optical spectra other than those that have been measured.

In another particular embodiment of the invention, the condition monitor neural network 304 is a fuzzy min-max neural network. A fuzzy min-max neural network is particularly good at classifying a set of inputs as belonging to one category or another. Thus, a fuzzy min-max neural network is particularly useful for implementing the process condition monitor 104 (FIG. 1), which is used to determine whether the condition of the process environment 101 is of a certain type, e.g., an "out-of-bounds" condition or a particular predetermined condition. A fuzzy min-max neural network that can be used with the invention is described in detail in Simpson, P. K. "Fuzzy Min-Max Neural Networks—Part 1: Classification", IEEE Trans. on Neural Networks, Vol. 3, No. 5, September 1992, and Simpson, P. K. "Fuzzy Min-Max Neural Networks—Part 2: Clustering", IEEE Trans. on Fuzzy Systems, Vol. 1, No. 1, February 1993, the disclosures of which are incorporated by reference herein. Below, a brief description of a fuzzy min-max neural network is given.

"Fuzzy logic" mimics the capability of human reasoning to deal with ambiguous or imprecise concepts. The key concept in fuzzy logic is that of membership in a "fuzzy set". Fuzzy sets provide a mechanism for representing linguistic constructs such as "many" or "few". A fuzzy set A is defined as the ordered pair $\{x, m_A(x)\}$, where x is an element of the "universe of discourse" and $0 <= m_A(x) <= 1$. The "membership function", $m_A$, describes the degree to which the object x belongs to the set A. Operations on fuzzy sets are extensions of those used for traditional sets. In particular, the union and intersection of fuzzy sets (denoted $A \cap B$ and $A \cup B$) are defined as follows:

$$m_{A \cap B}(x) = \max(m_A(x), m_B(x)) \quad (1)$$

$$m_{A \cup B}(x) = \min(m_A(x), m_B(x)) \quad (2)$$

Figure 5A:
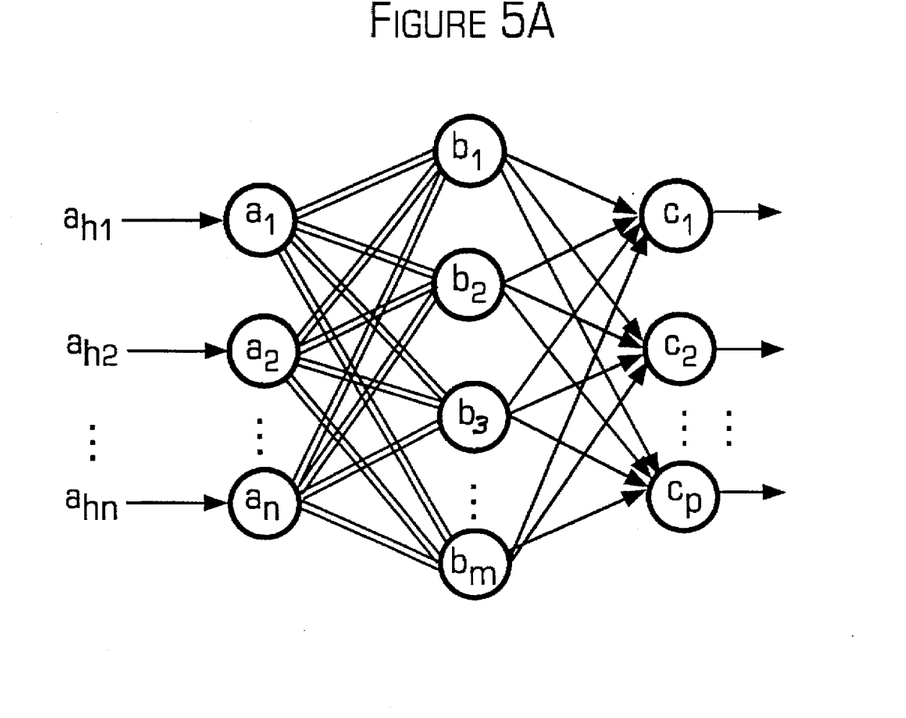
FIG. 5A is a schematic diagram of a fuzzy min-max neural network that illustrates the structure of a fuzzy min-max neural network for use with the invention.

FIG. 5A is a schematic diagram of a fuzzy min-max neural network 500 that illustrates the structure of a fuzzy min-max neural network for use with the invention. The network 500 includes a multiplicity of input nodes $a_1$ through $a_n$, a multiplicity of "hyperbox" nodes $b_1$ through $b_m$, and a multiplicity of class (output nodes $c_1$ through $c_p$. Inputs $a_{h1}$ through $a_{hn}$ ("input vector" $A_h$) are supplied to the input nodes $a_1$ through $a_n$, respectively. Each hyperbox node represents an n-dimensional hyperbox in n-dimensional input vector space. For a given input vector $A_h$, each hyperbox node $b_j$ calculates the membership function $m_j$ of the input vector $A_h$ for the associated hyperbox. The membership functions $m_1$ through $m_m$ of the hyperboxes $b_1$ through $b_m$, respectively, are then transferred to the class nodes $c_1$ through $c_p$.

Figure 5B:
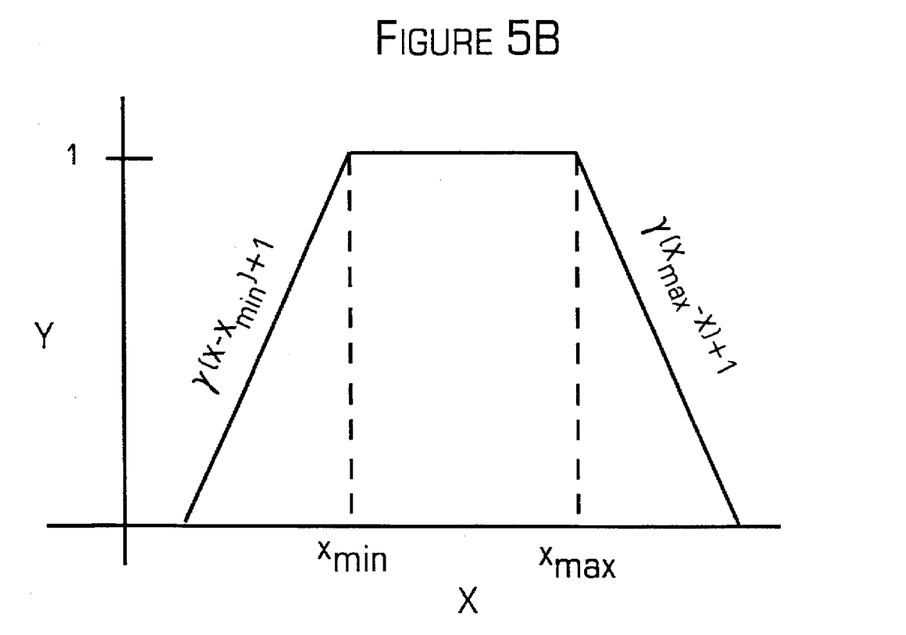
FIG. 5B is a graph of a trapezoidal membership function such as can be used with the fuzzy min-max neural network of FIG. 5A.

The membership function of an input vector $A_h$ is calculated as a combination of individual membership functions, one for each input value $a_{hi}$. In general, membership functions may have any shape. A typical membership function y for an input value ahi has a trapezoidal shape as shown in FIG. 5B (for simplicity, the input value $a_{hi}$ is designated by 'x'. The parameters necessary for describing the trapezoidal membership function y are the minimum value $(x_{min})$ and maximum value $(x_{max})$ of the input value x, between which the membership function y has a value of 1, and a preselected sensitivity parameter γ that determines how steeply the value of the membership function y decreases from 1 when the input value $a_{hi}$ has a value outside of the minimum and maximum values $x_{min}$ and $x_{max}$ (as shown by the expressions γ $(x-x_{min})+1$ and γ$(x_{max}-x)+1$). The membership function y cannot have a value less than zero. The membership function $m_j$ of the input vector $A_h=\{a_{hi}\}$ for hyperbox $b_j$ is the average of the membership functions $y_i$ for all input values $a_{hi}$:

$$m_j(A_h, V_j, W_j) = 1/n \Sigma y_i \quad (3)$$

When operated as a classifier, each class is assigned a hidden-layer node. A training procedure is performed with exemplars: input patterns for which the class is known. As training inputs are presented, the hyperbox weights $V_j$ and $W_j$ (which are essentially the $x_{min}$ and $x_{max}$ values) are modified so that the membership function values accurately reflect the class of the input. The modification is an expansion-contraction procedure, the details of which are described in the Simpson references cited above. The net result is that a mapping of input patterns to classifications is achieved that will also classify new patterns accurately to within some small tolerance of error. Also of importance, patterns different than any of the trained classes can be classified as not belonging to any of the known classes.

As implemented in the present invention, the inputs $a_{h1}$ through $a_{hn}$ to the fuzzy min-max neural network 500 are the various properties making up the environment fingerprint. In a plasma process, for example, the inputs $a_{h1}$ through $a_{hn}$ could each be the light intensity at a particular wavelength of the optical spectrum of the plasma light. The network 500 is trained by a clustering process to determine the hyperbox weights V and W (essentially the X min and the X max values). Class node weights (U) are trained by standard techniques to give the correct classification of the input pattern. For plasma etch, the condition classes could be "normal" for spectra similar to any of those in the normal range of operation, "end point" for spectra that are seen when the layer of interest has been removed, and "fault" for spectra that are different than those used to characterize the normal range of operation, and which thus indicate that the process is out of the normal range.

As noted above, in the process control system 300, the translator 108 of the system 100 (FIG. 1) is embodied by a fixed translator 308a and an adaptive translator 308b. The fixed translator 308a uses the calculated difference between the process state estimate produced by the results estimator neural network 305 and the target condition estimate produced by the target results module 106 to produce a coarse estimate of the control response. The adaptive translator 308b uses the calculated difference and the coarse control response estimate to produce a fine-tuned control response that is supplied to the control module 109. As explained in more detail below, the adaptive translator 308b can change configuration over time in order to minimize error in the translation. The control settings of the processing apparatus 111 are input to the adaptive translator 308b to enable the adaptation.

In one embodiment of the invention, the adaptive translator 308b is a neuro-observer neural network. A neuro-observer neural network that can be used with the invention is described in detail in Stubberud, A. R., Lobbia, R. N. and Stubberud, S. C., "Improved Nonlinear System Identification Using Neural Networks," Proceedings of the 7th International Conference on Neural Networks and Their Applications, December 1994, the disclosure of which is incorporated by reference herein. Below, a brief description of a neuro-observer neural network is given.

When a feedback control system is designed, a mathematical model of the process often is required. This model becomes the foundation for the design of the control law. The output of this model is a state vector that defines the dynamic state of the process at a given time. Normally, the state vector of the actual process or system is not directly observable because of limited sensor availability.

The accuracy of the mathematical model dictates the level of performance that can be achieved by a particular control law. A more accurate model permits greater robustness in the response performance and is less sensitive to the effects of noise and external disturbances. Errors in the model and noise in the measurements make the interpretation of the measurements imprecise. When modeling errors exist, the control law must be designed to compensate for the modeling uncertainty at the expense of the system's performance. For example, in the open-loop control of plasma etching, a recipe for the process step leads to a statistical variation from one run to the next which may become unacceptable if great precision is required.

Figure 6:
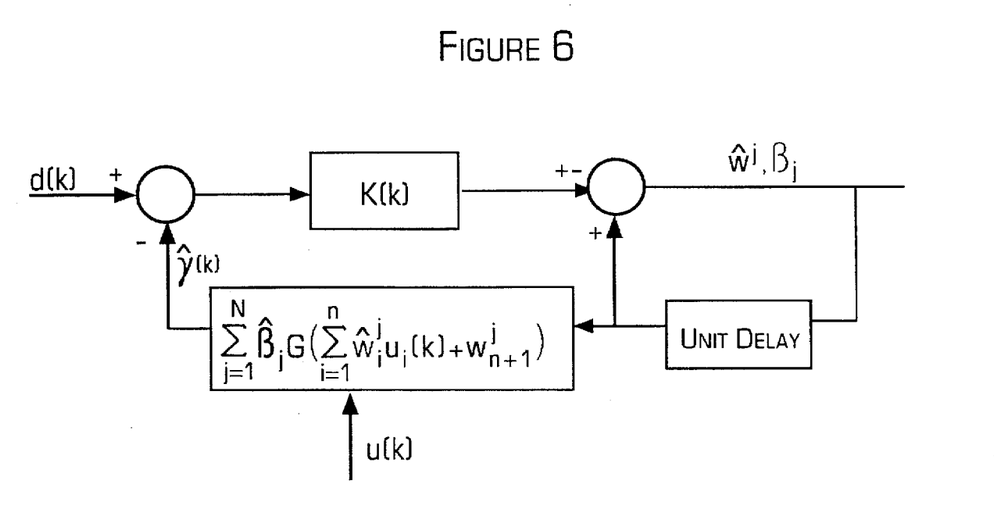
FIG. 6 illustrates operation of an extended Kalman filter for use with the invention as an adaptive translator.

The EKF is the most widely used method for performing state estimations of noisy nonlinear systems. However, in almost all real problems, the input-state coupling function fk in the EKF is not completely known, and a model $\sim_{fk}$ is used such that $$E_k = f_k - \sim_{f_k}$$

Depending on the relative size of the error $E_k$ compared to $f_k$, the EKF state estimate could be quite inaccurate. To better estimate $f_k$ in the present invention, a multilayer feed-forward neural network is implemented to learn the function $E_k$. Our model of the system then can be represented by our original model approximation and the neural network:

$$\sim_{f_k} + g_k$$

where $g_k$ represents the neural network. To develop the better approximation of the true physical system with the addition of the neural network, the weights of the net are adjusted in an on-line fashion until the mismodeling error has been reduced to a satisfactory level. The training paradigm that we employ in the neuro-observer is a relatively new one involving a Kalman filtering technique.

The EKF training paradigm is simply the EKF algorithm with the "system" of the weights.

As with most training techniques, the weights are trained in order to minimize the mean-squared-error between a desired signal and the approximate signal. In this case, the error signal being minimized is the error between origin error estimate $E_k$ and the approximation of the signal by the neural net g(*).

For the neuro-observer, the state estimator and the trainer become coupled. Thus, a single EKF is required to both perform the state estimates and the weight training. The coupling of the trainer and the state estimator is important because it provides the observability for the weight training in this problem.

The neuro-observer can then be attached to any observable system to provide an estimate of the current states of the system. The neuro-observer learns the disparities between the current model and the true process, thus improving the state estimates. Details of the art of implementing this scheme is contained in the references, in particular, Stubberaud, et al.

The basic premise of model-reference control is that we want the physical process and a reference model to behave in the same way. The error between the estimate of the process' current state and the ideal model is used to drive the controller. In the case of plasma etch, the error is the difference between the process results estimator neural network and the (pre-selected) target.

For plasma etch, there again exists a complex and nonlinear relationship between the process results and the controls of the plasma. There thus may be no simple plant model to use in conjunction with the neuro-observer. The present invention uses an additional, non-adaptive neural network (fixed translator) to supply a coarse estimate of the control response, equivalent to the function f in the equations above. Fine tuning is provided by a neuro-observer (adaptive translator) as described above.

The invention can be used to enable real-time control of a process using information that is indirectly related to the state of the process. In particular, the invention can be used for control of plasma processes such as plasma etching, plasma deposition, ion implantation, sputtering and photoresist stripping among others. Such processes are used, for example, in processing a semiconductor wafer to make an electronic device.

In one embodiment, the invention processing apparatus 111 (FIG. 1) is a plasma processing apparatus. Plasma processing apparatus are well known. A brief description of a plasma processing apparatus is given below.

Figure 7:
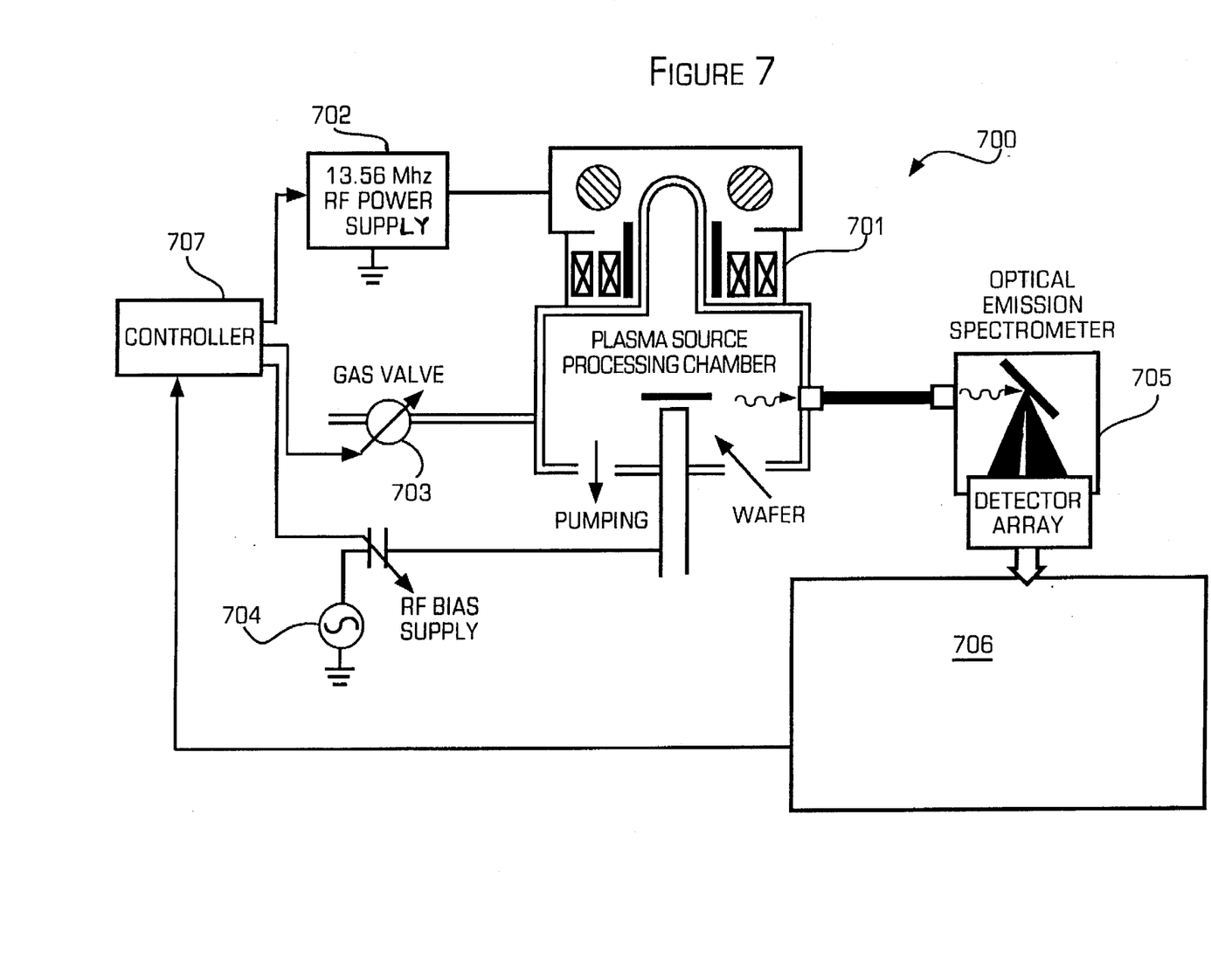
FIG. 7 is a simplified representation of a plasma processing apparatus with which the invention can be used.

FIG. 7 is a simplified representation of a plasma processing apparatus 700 with which the invention can be used. A plasma process is carried out in a plasma reactor 701. As illustrated in FIG. 7, a wafer is mounted in the plasma reactor 701 and is processed using a plasma. The plasma reactor 701 is a helicon-wave plasma source. Such a reactor is commercially available from, for instance, Plasma Materials and Technologies, Inc., located in Chatsworth, Calif. as a Pinnacle 8000. An RF power supply 702 is used to supply RF power to drive the plasma reaction in the plasma reactor 701. A gas valve 703 controls the flow of gases into the plasma reactor 701. An RF bias supply 704 electrically biases a chuck which secures the wafer.

An optical emission spectrometer 705 is used to measure light intensities to obtain the optical spectra. Optical emission spectrometers that can be used with the invention are readily commercially available. Generally, the spectrometer 705 can be placed at any location with respect to the plasma reactor 701 (as long as the spectrometer 705 can sense the light being emitted from the reactor 701), since the relative light intensities among wavelengths are not significantly directionally dependent.

The optical spectra are input to a system 706 according to the invention, as described in more detail above. The system 706 can be implemented, for instance, on a digital computer.

The system 706 produces control signals which are input to controller 707. The controller 707 is conventional and is commericially available from a variety of sources. The controller 707 controls the settings of the RF power supply 702, the gas valve 703 and the RF bias supply 704 as appropriate to achieve the desired process condition within the plasma reactor 701.

Various embodiments of the invention have been described. The descriptions are intended to be illustrative, not limitative. Thus, it will be apparent to one skilled in the art that certain modifications may be made to the invention as described without departing from the scope of the claims set out below.

We claim:

1. A system for controlling a process implemented by a processing apparatus, the process being characterized by process state having a plurality of process properties, each process property having a process property value at each instant in time, comprising:

means for detecting a process fingerprint, the process fingerprint being indirectly representative of a plurality of process property values;

a process condition monitor for monitoring the process in real-time to ascertain whether a particular process condition exists;

a process property estimator for estimating a process property value at an instant in time based on the process fingerprint;

means for comparing the process property value estimate to a target process property value to produce a process property value difference; and means for determining a control response as a function of the process property value difference, the control response adapted to change the process property value and the process state of the processing apparatus in real-time based on the process property value difference.

2. A system as in claim 1, wherein:

the process condition monitor is a condition monitor neural network; and the process property results estimator is a property estimator neural network.

3. A system as in claim 2, wherein the condition monitor neural network is a fuzzy min-max neural network.

4. A system as in claim 2, wherein the property estimator neural network is a multilayer perceptron neural network.

5. A system as in claim 2, wherein:

the condition monitor neural network is a fuzzy min-max neural network; and the property estimator neural network is a multilayer perceptron neural network.

6. A system as in claim 1, wherein the means for determining a control response further comprises:

a fixed translator that uses the process property value difference to produce a coarse estimate of the control response; and an adaptive translator that uses the process property value difference and the coarse estimate to produce a fine-tuned control response.

7. A system as in claim 1, wherein the process is a plasma process.

8. The system of claim 1, wherein the process signature detecting means comprises means for detecting electromagnetic radiation from the process, the electromagnetic radiation having a plurality of wavelengths.

9. A system for controlling a plasma process implemented by a processing apparatus, the process being characterized by a process state having a plurality of process properties, each process property having a process property value at each instant in time, comprising:

means for detecting a process fingerprint, the process fingerprint being indirectly representative of a plurality of process property values;

a multilayer perceptron neural network for producing a process property value estimate at an instant in time for a particular process property based on said process fingerprint;

means for comparing the process property value estimate to a target process property value to produce a process property value difference; and means for determining a control response as a function of the process property value difference, the control response adapted to change the process property value and the process state of the processing apparatus in real-time based on the process property value difference.

10. The system of claim 9, wherein the process signature detecting means comprises means for detecting electromagnetic radiation from the process, the electromagnetic radiation having a plurality of wavelengths.

11. A system for controlling a plasma process implemented by a processing apparatus, the process being characterized by a process state having a plurality of process properties, each process property having a process property value at each instant in time, comprising:

means for detecting a process fingerprint, the process fingerprint being indirectly representative of a plurality of process property values;

a fuzzy min-max neural network for monitoring the process to ascertain whether a particular process property value exists and to generate a process property value estimate;

means for comparing the process property value estimate to a target process property value to produce a process property value difference; and means for determining a control response as a function of the process property value difference, the control response adapted to change the process property value and the process state of the processing apparatus in real-time based on the process property value difference.

12. The system of claim 11, wherein the process signature detecting means comprises means for detecting electromagnetic radiation from the process, the electromagnetic radiation having a plurality of wavelengths.

* * * * *